(12) United States Patent
Tan et al.

(10) Patent No.: US 11,946,134 B2
(45) Date of Patent: Apr. 2, 2024

(54) IN SITU NUCLEATION FOR NANOCRYSTALLINE DIAMOND FILM DEPOSITION

(71) Applicant: Applied Materials, Inc., Santa Clara, CA (US)

(72) Inventors: Sze Chieh Tan, Singapore (SG); Vicknesh Sahmuganathan, Singapore (SG); Eswaranand Venkatasubramanian, Santa Clara, CA (US); Abhijit Basu Mallick, Sunnyvale, CA (US); John Sudijono, Singapore (SG)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 17/585,755

(22) Filed: Jan. 27, 2022

(65) Prior Publication Data
US 2023/0235452 A1 Jul. 27, 2023

(51) Int. Cl.
*C23C 16/27* (2006.01)
*C23C 16/02* (2006.01)
*C23C 16/455* (2006.01)
*B82Y 40/00* (2011.01)

(52) U.S. Cl.
CPC ........ *C23C 16/279* (2013.01); *C23C 16/0227* (2013.01); *C23C 16/45536* (2013.01); *B82Y 40/00* (2013.01)

(58) Field of Classification Search
None
See application file for complete search history.

(56) References Cited

U.S. PATENT DOCUMENTS

| | | | |
|---|---|---|---|
| 2004/0258918 A1* | 12/2004 | Chaffin, III | C23C 16/505 428/408 |
| 2009/0022969 A1* | 1/2009 | Zhang | C23C 30/005 428/216 |
| 2009/0029067 A1* | 1/2009 | Sciamanna | C23C 16/26 427/577 |
| 2010/0034984 A1* | 2/2010 | Asmussen | C23C 16/274 427/575 |

(Continued)

FOREIGN PATENT DOCUMENTS

| | | |
|---|---|---|
| JP | 07069792 A | 3/1995 |
| KR | 20120121340 A | 11/2012 |
| WO | 2007034808 A1 | 3/2007 |

OTHER PUBLICATIONS

Arnault, Jean-Charles, et al., "Surface Science Contribution to the BEN Control on Si(100) and 3C-SiC(100): Towards Ultrathin Nanocrystalline Diamond Films", Chem. Vap. Deposition 2008, 14, 187-195.

(Continued)

*Primary Examiner* — Jose I Hernandez-Kenney
(74) *Attorney, Agent, or Firm* — Servilla Whitney LLC

(57) ABSTRACT

Methods of depositing a nanocrystalline diamond film are described. The method may be used in the manufacture of integrated circuits. Methods include treating a substrate with a mild plasma to form a treated substrate surface, incubating the treated substrate with a carbon-rich weak plasma to nucleate diamond particles on the treated substrate surface, followed by treating the substrate with a strong plasma to form a nanocrystalline diamond film.

14 Claims, 2 Drawing Sheets

(56) References Cited

U.S. PATENT DOCUMENTS

| | | | |
|---|---|---|---|
| 2010/0084634 A1 | 4/2010 | Gamo et al. | |
| 2015/0099123 A1* | 4/2015 | Barbee | C23C 16/26 428/408 |
| 2015/0315707 A1 | 11/2015 | Xue et al. | |
| 2016/0064500 A1* | 3/2016 | Chen | H01L 21/31122 257/315 |

OTHER PUBLICATIONS

Frgala, Z., et al., "Microwave PECVD of Nanocrystalline Diamond with RF Induced Bias Nucleation", Czechoslovak Journal of Physics, vol. 56.

Jiang, X., et al., "Nucleation and initial growth phase of diamond thin films on (100) silicon", The American Physical Society, vol. 50, No. 12.

Maillard-Schaller, E., et al., "Local heteroepitaxy of diamond on silicon (100): A study of the interface structure", The American Physical Society, vol. 55, No. 23.

Mandal, Soumen, et al., "Chemical Nucleation of Diamond Films", ACS Appl. Mater. Interfaces 2016, 8, 26220-26225.

Stoner, B. R., et al., "Characterization of bias-enhanced nucleation of diamond on silicon by in vacuo surface analysis and transmission electron microscopy", The American Physical Society, vol. 45, No. 19.

Williams, O. A., "Nanocrystalline diamond", Diamond & Related Materials 20 (2011) 621-640.

Yang, Woo Seok, "Effects of secondary pretreatments of substrate on the nucleation of diamond film", Journal of Materials Research, vol. 11, No. 7, Jul. 1996.

PCT International Search Report and Written Opinion in PCT/US2023/060958 dated May 19, 2023, 9 pages.

* cited by examiner

IN SITU NUCLEATION FOR NANOCRYSTALLINE DIAMOND FILM DEPOSITION

TECHNICAL FIELD

Embodiments of the present disclosure pertain to the field of electronic device manufacturing, and, in particular, to integrated circuit (IC) manufacturing. More particularly, embodiments of the disclosure provide methods of depositing diamond-like carbon hard mask films, which can be used for patterning applications.

BACKGROUND

As the semiconductor industry introduces new generations of integrated circuits (ICs) having higher performance and greater functionality, the density of the elements that form those ICs is increased, while the dimensions, size, and spacing between the individual components or elements are reduced. While in the past, such reductions were limited only by the ability to define the structures using photolithography, device geometries having dimensions measured in μm or nm have created new limiting factors such as the conductivity of the metallic elements, the dielectric constant of the insulating material(s) used between the elements, or challenges in 3D-NAND or DRAM processes. These limitations may be addressed by more durable and higher hardness hard masks.

Diamond is a material with high hardness, chemical inertness, high thermal conductivity, and good optical transparency, making it promising in microelectronic applications. Diamond has emerged as a promising candidate for a myriad of microelectronic applications. The large discrepancy in the surface energies of diamond and silicon (6 J cm$^{-2}$ vs. 1.5 J cm$^{-2}$), low sticking coefficients of the gaseous precursors (e.g., hydrocarbon radicals) and strong competition from the nondiamond phases, however, typically result in poor diamond nucleation density (~$10^4$ cm$^{-2}$) on untreated silicon.

To address poor diamond nucleation density, the substrate is usually pre-treated (e.g., mechanical abrasion or microchipping) and/or seeded with nano-diamond (ND) particles prior to deposition. Such seeding methods, however, consist of multiple solution-based procedures which are cumbersome and not cleanroom compatible. Bias-enhanced nucleation (BEN), on the other hand, is one of the few nucleation techniques that can be performed in-situ. It involves the bombardment of methane-rich (4-10%) ionized gas species on the surface of a negatively-charged biased substrate, allowing the formation of a carbide layer with improved substrate adhesion. With BEN, nucleation densities greater than $10^{11}$ cm$^{-2}$ had been reported. Unfortunately, the application of BEN is limited by the presence of substrate surface damages (e.g., in the form of holes as deep as 2-3 μm in diameter), difficulty in applying bias uniformly over large areas, and the need for a conductive substrate.

Hence, from a large-scale manufacturing and production perspective, both solution-based seeding of NDs and BEN are unfit for the purpose.

There is a need, therefore, for improved processes for forming the deposition of uniform nanocrystalline diamond (NCD) films.

SUMMARY

One or more embodiments of the disclosure are directed to a method of forming film. In one or more embodiments, the method comprises: exposing a substrate to a first plasma from a plasma source, the first plasma source comprising one or more of $C_xH_y$, wherein y≥x, carbon dioxide ($CO_2$), hydrogen ($H_2$), nitrogen ($N_2$), and argon (Ar) to provide a treated substrate; incubating the treated substrate with a gas stream and a second plasma to nucleate diamond particles on a top surface of the substrate, the gas stream comprising a hydrocarbon; and exposing the diamond particles to a third plasma having a power greater than 50 W to form a nanocrystalline diamond film on the top surface of the substrate.

Other embodiments of the disclosure are directed to a method of forming a diamond film. In one or more embodiments, the method comprises: exposing a treated substrate to a gas stream to nucleate diamond particles on a top surface of the treated substrate, the gas stream comprising a hydrocarbon; and exposing the diamond particles to a plasma having a power greater than 50 W to form a nanocrystalline diamond film on the top surface of the substrate.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments. The embodiments as described herein are illustrated by way of example and not limitation in the figures of the accompanying drawings in which like references indicate similar elements.

DETAILED DESCRIPTION

Figure 1:
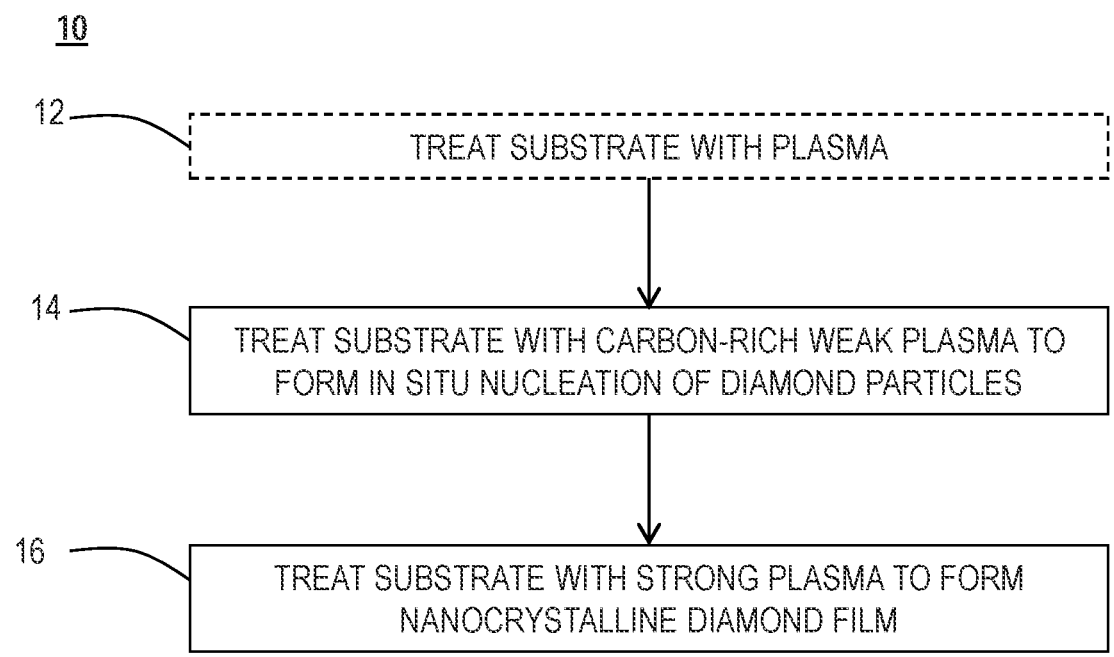
FIG. 1 illustrates a process flow diagram of a method for depositing a nanocrystalline diamond film according to one or more embodiments.

Before describing several exemplary embodiments of the disclosure, it is to be understood that the disclosure is not limited to the details of construction or process steps set forth in the following description. The disclosure is capable of other embodiments and of being practiced or being carried out in various ways.

As used in this specification and the appended claims, the terms "precursor," "reactant," "reactive gas" and the like are used interchangeably to refer to any gaseous species that can react with the substrate surface.

A "substrate" as used herein, refers to any substrate or material surface formed on a substrate upon which film processing is performed during a fabrication process. For example, a substrate surface on which processing can be performed include materials such as silicon, silicon oxide, strained silicon, silicon on insulator (SOI), carbon doped silicon oxides, amorphous silicon, doped silicon, germanium, gallium arsenide, glass, sapphire, and any other materials such as metals, metal nitrides, metal alloys, and other conductive materials, depending on the application. Substrates include, without limitation, semiconductor wafers. Substrates may be exposed to a pretreatment process to polish, etch, reduce, oxidize, hydroxylate, anneal and/or bake the substrate surface. In addition to film processing directly on the surface of the substrate itself, in the present disclosure, any of the film processing steps disclosed may also be performed on an under-layer formed on the substrate as disclosed in more detail below, and the term "substrate surface" is intended to include such under-layer as the context indicates. Thus, for example, where a film/layer or partial film/layer has been deposited onto a substrate surface, the exposed surface of the newly deposited film/layer becomes the substrate surface.

As used herein, the phrase "nanocrystalline diamond" refers a solid film of diamond typically grown on a substrate, such as silicon. In one or more embodiments, nanocrystallinity is the result of the enhanced re-nucleation reaction in diamond growth, where the growth of diamond crystal is disrupted due to the fluctuation of surrounding environments such as the amounts of radical species, temperature, and pressure. In one or more embodiments, nanocrystalline diamond layers are mainly comprised of small diamond crystals in nanospheres, or a nanocolumnar shape, and amorphous carbon distributed usually distributed in the positions between surrounding crystals or accumulate in the grain boundaries. Nanocrystalline diamond is used as a hard mask material in semiconductor applications because of its chemical inertness, optical transparency, and good mechanical properties.

One or more embodiments of the disclosure advantageously provide a novel method for the in situ nucleation and growth of nanocrystalline diamond films. Embodiments describe the development and utilization of plasma and gas chemistry for substrate treatment and the nucleation and growth of nanocrystalline diamond films. In one or more embodiments, prior solution-based substrate treatment/ cleaning nor additional seeding methods such as sonication with nanodiamonds or mechanical scratching are not required. Likewise, no unique chemicals are required during the process.

In one or more embodiments, a nanocrystalline diamond layer is formed on a substrate. The process of one or more embodiments advantageously produces a nanocrystalline diamond layer with high density, high hardness, high etch selectivity, low stress, and excellent thermal conductivity.

Hard masks are used as etch stop layers in semiconductor processing. Ashable hard masks have a chemical composition that allows them to be removed by a technique referred to as ashing once they have served their purpose. An ashable hard mask is generally composed of carbon and hydrogen with trace amounts of one or more dopants (e.g., nitrogen, fluorine, boron, silicon). In a typical application, after etching, the hard mask has served its purpose and is removed from the underlying layer. This is generally accomplished, at least in part, by ashing, also referred to as "plasma ashing" or "dry stripping." Substrates with hard masks to be ashed, generally partially fabricated semiconductor wafers, are placed into a chamber under vacuum, and oxygen is introduced and subjected to radio frequency power, which creates oxygen radicals (plasma). The radicals react with the hard mask to oxidize it to water, carbon monoxide, and carbon dioxide. In some instances, complete removal of the hard mask may be accomplished by following the ashing with additional wet or dry etching processes, for example when the ashable hard mask leaves behind any residue that cannot be removed by ashing alone.

Hard mask layers are often used in narrow and/or deep contact etch applications, where photoresist may not be thick enough to mask the underlying layer. This is especially applicable as the critical dimension shrinks.

V-NAND, or 3D-NAND, structures are used in flash memory applications. V-NAND devices are vertically stacked NAND structures with a large number of cells arranged in blocks. As used herein, the term "3D-NAND" refers to a type of electronic (solid-state) non-volatile computer storage memory in which the memory cells are stacked in multiple layers. 3D-NAND memory generally includes a plurality of memory cells that include floating-gate transistors. Traditionally, 3D-NAND memory cells include a plurality of NAND memory structures arranged in three dimensions around a bit line.

An important step in 3D-NAND technology is slit etch. As the number of tiers increases in each technology node, to control the slit etch profile, the thickness of the hard mask film has to proportionally increase to withstand high aspect etch profiles. Currently, amorphous carbon (aC:H) films are used due to high hardness and easy to strip after slit etch. However, amorphous carbon hard mask films have delamination at bevel and poor morphology, leading to pillar striations.

One or more embodiments of the disclosure are described with reference to the Figures. FIG. 1 illustrates a process flow diagram of a method 100 according to one or more embodiments. FIGS. 2A through 2E illustrate schematic cross-sectional view of a substrate 102 being processed according to the method of one or more embodiments.

Figure 2A:
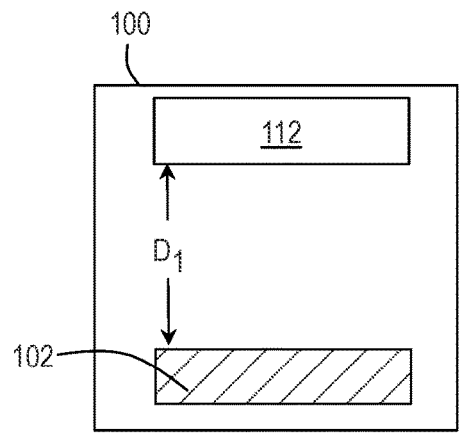
FIG. 2A illustrates a schematic cross-sectional view of a substrate during the method according to one or more embodiments.
Figure 2B:
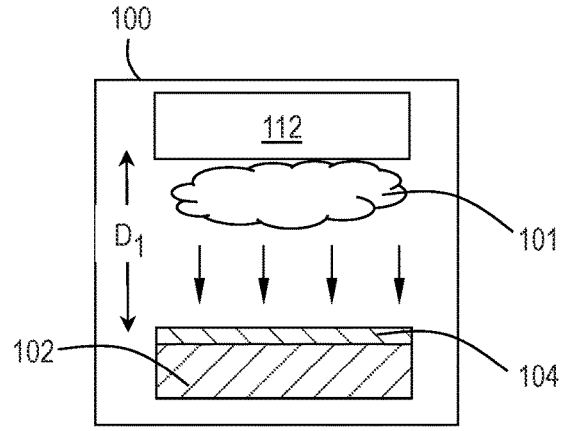
FIG. 2B illustrates a schematic cross-sectional view of a substrate during the method according to one or more embodiments.

Referring to FIGS. 1 and 2A-2B, a method 10 of forming a nanocrystalline diamond film 120 is described. In some embodiments, the method 10 comprises, at operation 12, treating a substrate 102 with a plasma 101 from a plasma source 112 to form a treated substrate surface 104. The substrate 102 surface is exposed to a mild first plasma 101 in the first plasma process chamber 100 for a first plasma time period $T_{P1}$ to form treated or pre-treated substrate surface 104.

As used herein, a "substrate surface" refers to any substrate surface upon which a layer may be formed. The substrate surface may have one or more features formed therein, one or more layers formed thereon, and combinations thereof. The substrate (or substrate surface) may be pretreated prior to the deposition of the molybdenum-containing layer, for example, by polishing, etching, reduction, oxidation, halogenation, hydroxylation, annealing, baking, or the like.

The substrate may be any substrate capable of having material deposited thereon, such as a silicon substrate, a III-V compound substrate, a silicon germanium (SiGe) substrate, an epi-substrate, a silicon-on-insulator (SOI) substrate, a display substrate such as a liquid crystal display (LCD), a plasma display, an electro luminescence (EL) lamp display, a solar array, solar panel, a light emitting diode (LED) substrate, a semiconductor wafer, or the like. In some embodiments, one or more additional layers may be disposed on the substrate such that the polymerizable seed layer may be at least partially formed thereon. For example, in some embodiments, a layer comprising a metal, a nitride, an oxide, or the like, or combinations thereof may be disposed on the substrate and may have the polymerizable seed layer formed upon such layer or layers. In one or more embodiments, the substrate comprises silicon (Si) or poly-silicon (p-Si). In some embodiments, the substrate comprises a poly-Silicon substrate. In some embodiments, the substrate is chemically and/or physically unmodified.

The first plasma process chamber 100 can be any suitable plasma chamber with any suitable plasma source, such as, but not limited to, remote, microwave, capacitively coupled plasma (CCP), or inductively coupled plasma (ICP). In some embodiments, flow rates and other processing parameters described below are for a 300 mm substrate. It should be understood these parameters can be adjusted based on the size of the substrate processed and the type of chamber used without diverging from the embodiments disclosed herein. In specific embodiments, the mild first plasma 101 comprises one or more of a capacitively coupled plasma, inductively coupled plasma, pulsed discharge plasma, microwave plasma, hot filament, or electron cyclotron resonance plasma.

In some embodiments, the first plasma 101 comprises one or more of an organic species having the empirical formula $C_xH_y$, where $y \geq x$, argon (Ar), molecular nitrogen ($N_2$), carbon dioxide ($CO_2$), or molecular hydrogen gas ($H_2$).

In some embodiments, the first plasma 101 is generated with a power greater than 50 watts, 100 watts, or 150 watts. In one or more embodiments, the plasma treatment may occur at any suitable power. In one or more embodiments, the power is greater than 50 W. In other embodiments, the power is in a range of from 50 W to 12 kW, or in a range of from 51 W to 12 kW, or in a range of from 100 W to 10 kW, or in a range of from 100 W to 5 kW, or in a range of from 100 W to 1 kW.

In some embodiments, the substrate 102 is maintained at a temperature in the range of from 20° C. to 600° C. during formation of the treated substrate surface 104.

In some embodiments, forming the treated substrate surface 104 comprises more than one cycle of exposure to the mild first plasma 101. In some embodiments, forming the treated substrate face 104 comprises in the range of 1 to 1000 cycles of exposures to the mild first plasma 101.

The first plasma process chamber 100 of some embodiments comprises a first plasma source 112, which may include one or more of a showerhead, electrodes, resonators, linear antenna, and the like. In one or more embodiments, the first plasma source 112 is positioned at a first distance $D_1$ from the top surface of the substrate 102. In some embodiments, the first distance, $D_1$, is greater than or equal to 10 mm, 15 mm, 20 mm, or 25 mm.

Figure 2C:
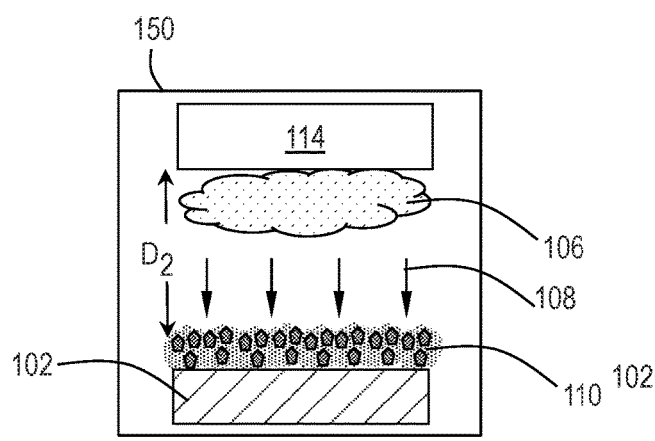
FIG. 2C illustrates a schematic cross-sectional view of a substrate during the method according to one or more embodiments.
Figure 2D:
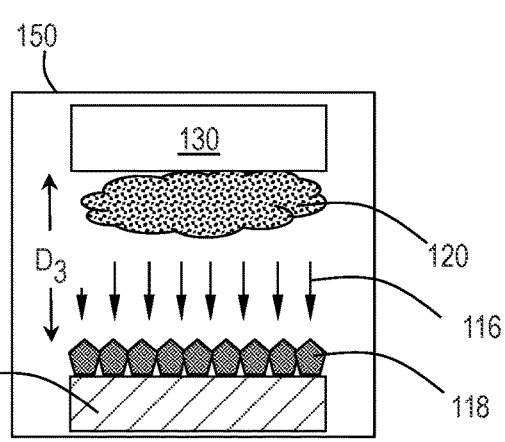
FIG. 2D illustrates a schematic cross-sectional view of a substrate during the method according to one or more embodiments.

Referring to FIG. 1 and FIG. 2C, at operation 14, the treated substrate 104 is incubated with a carbon-rich gas stream 108 and a second plasma 106 to nucleate diamond particles forming a diamond nuclei layer 110 on the top surface of the substrate 102.

In one or more embodiments, the diamond nuclei layer 110 is formed in a second plasma process chamber 150 with a second mild plasma 106 generated by a plasma source 114. In other embodiments, the diamond nuclei layer 110 is formed in the first plasma process chamber 100 with a second mild plasma 106 generate by a plasma source 114. In some embodiments, the second mild plasma 106 can be generate by the first plasma source 112 but using different gases (compositions).

The second plasma process chamber 150 and the first process chamber 100 can be any suitable plasma chamber with any suitable plasma source, such as, but not limited to, remote, microwave, capacitively coupled plasma (CCP), or inductively coupled plasma (ICP). In some embodiments, flow rates and other processing parameters described below are for a 300 mm substrate. It should be understood these parameters can be adjusted based on the size of the substrate processed and the type of chamber used without diverging from the embodiments disclosed herein. In specific embodiments, the mild second plasma 106 comprises one or more of a capacitively coupled plasma, inductively coupled plasma, pulsed discharge plasma, microwave plasma, hot filament, or electron cyclotron resonance plasma.

In some embodiments, the gas stream 108 and second mild plasma 106 comprises a hydrocarbon. In one or more embodiments, the hydrocarbon has a general formula of $C_mH_n$, where m is in a range from 1 to 120, and n is in a range of from 2 to 242. In specific embodiments, the hydrocarbon is selected from one or more of methane ($CH_4$), ethane ($C_2H_6$), propane ($C_3H_8$), butane ($C_4H_{10}$), pentane ($C_5H_{12}$), hexane ($C_6H_{14}$), heptane ($C_7H_{16}$), ethene ($C_2H_4$), propene ($C_3H_6$), butene ($C_4H_8$), pentene ($C_5H_{10}$), hexene ($C_6H_{12}$), heptane ($C_7H_{14}$), ethyne ($C_2H_2$), propyne ($C_3H_4$), butyne ($C_4H_6$), pentyne ($C_5H_8$), hexyne ($C_6H_{10}$), and heptyne ($C_7H_{12}$).

In one or more embodiments, the second mild plasma 106 may include, in addition to the hydrocarbon, one or more of argon (Ar), molecular nitrogen ($N_2$), carbon dioxide ($CO_2$), or molecular hydrogen gas ($H_2$). In one or more embodiments, the gas stream 108 comprising the hydrocarbon is co-flowed with one or more of argon (Ar), molecular nitrogen ($N_2$), carbon dioxide ($CO_2$), or molecular hydrogen gas ($H_2$) during plasma generation.

In one or more embodiments, the gas stream 108 and the second mild plasma 106 comprise from 5% to 90% hydrocarbon.

In some embodiments, the second mild plasma 106 is generated with a power less than or equal to 15 kilowatts (kW), 12 kW, 10 kW, 9 kW, 8 kW, 7 kW, 6 kW, 5 kW, or 4 kW. In some embodiments, the gas stream 108 is ignited at a power of less than 12 kW to form the second mild plasma 106. In some embodiments, the second mild plasma 106 is a pulsed plasma with a duty cycle less than or equal to 75%, 70%, 65%, 60%, 55%, 50%, 45% or 40% at a frequency in the range of 50 Hz to 100 Hz, or in the range of 60 Hz to 90 Hz, or in the range of 70 Hz to 80 Hz. In some embodiments, the second mild plasma 106 has a power less than or equal to 6 kW with a duty cycle less than or equal to 50% at a frequency in the range of 70 Hz to 80 Hz. In some embodiments, the substrate 102 is maintained at a temperature in the range of 50° C. to 400° C. formation of the diamond nuclei layer 110.

In some embodiments, the treated substrate 104 is incubated with the gas stream 108 and the second mild plasma 106 for a time period in a range of from 1 second to 14,400 seconds. In some embodiments, the treated substrate 104 is incubated with the gas stream 108 and the second mild plasma 106 for a time period of less than 4 hours, or less than 3 hours, or less than 2 hours, or less than 1 hour.

In some embodiments, the substrate 102 is positioned at a second distance $D_2$ from the plasma source 114. In one or more embodiments, the second mild plasma 106 can be generated by the first plasma source 112 but using different gases (compositions). In some embodiments, the substrate 102 is positioned at a second distance $D_2$ less than or equal to 12 cm, 11 cm, 10 cm, 9 cm, or 8 cm from the second plasma source 114 or from the first plasma source 112. In some embodiments, the second plasma source 114 or the first plasma source 112 comprises a showerhead which acts as an electrode. In some embodiments, the second plasma source 114 comprises a weak microwave plasma source.

At operation 16, a full nanocrystalline diamond film 118 is grown from the diamond nuclei layer 110. As used in this manner, the term "grown" means that the full nanocrystalline diamond film 118 is formed on the diamond nuclei layer 110 and may incorporate the diamond nuclei layer 110 into the full nanocrystalline diamond film 118. The full nanocrystalline diamond film 118 can be epitaxially grown or deposited by any suitable technique known to the skilled artisan.

In some embodiments, growing the full nanocrystalline diamond film 118 occurs in the second plasma process chamber 150 using a strong plasma 120. In other embodiments, growing the full nanocrystalline diamond film 118 occurs in the first plasma process chamber 100 using a strong plasma 120. Thus, in one or more embodiments, the first plasma process chamber 100 and the second plasma process chamber 150 are the same chamber. In some embodiments, the full nanocrystalline diamond film 118 is grown using a strong conductively or inductively coupled plasma, microwave plasma, pulsed discharge plasma, microwave plasma, hot filament, or electron cyclotron resonance plasma. In some embodiments, the full nanocrystalline diamond film 118 is grown using a strong microwave plasma.

In some embodiments, the strong plasma 120 comprises a microwave plasma having a power greater than or equal to 3 kW, 4 kW or 5 kW with a duty cycle greater than or equal to 60%, 65%, 70%, 75% or 80%.

In some embodiments, the substrate 102 is maintained at a temperature in the range of room temperature (25° C.) to 750° C. during exposure to the strong microwave plasma 120. In some embodiments, the substrate 102 is maintained at a temperature greater than room temperature (25° C.), 50° C., 75° C., 100° C., 150° C., 200° C., or 250° C. during exposure to the strong microwave plasma 120.

During operation 16, the substrate 102 is positioned a distance $D_3$ from the third plasma source 130. In other embodiments, the strong plasma 120 can be generated by the first plasma source 112 and/or the second plasma source 114 but using different gases (compositions) or by a different third plasma source 130. In some embodiments, the distance $D_3$ is the same as the distance $D_2$. In some embodiments, the third distance $D_3$ is less than the second distance $D_2$. In some embodiments, the substrate 102 is positioned at a distance from the strong microwave plasma source 130, or from the first plasma source 112 or from the second plasma source 114, of less than 12 cm, 11 cm, 10 cm, 9 cm, or 8 cm.

Figure 2E:
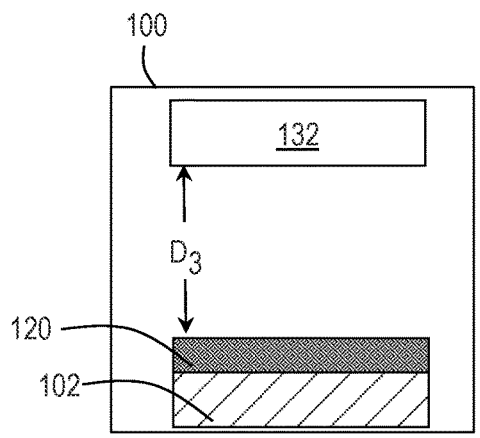
FIG. 2E illustrates a schematic cross-sectional view of a substrate during the method according to one or more embodiments.

With reference to FIG. 2E, in one or more embodiments, after being subjected to an extended period of main growth, the high nucleation density on the plasma-treated substrate 102 led to the formation of a fully coalesced nanocrystalline diamond film 120. In one or more embodiments, FIG. 2E illustrates how the fully coalesced nanocrystalline diamond film 120 looks after the entire process is completed. The difference between nanocrystalline diamond film 118 and fully coalesced nanocrystalline diamond film 120 is that in the nanocrystalline diamond film 118, the diamond nuclei from diamond nuclei layer 110 grow in size to become individual, larger diamond particles. These larger diamond particles are, however, isolated from each other. As these large diamond particles continue to grow in size, they eventually come into contact with the neighboring particles and begin to merge/coalesce with each other. This forms a dense, packed nanocrystalline diamond film, which becomes the full coalesced nanocrystalline diamond film 120.

The disclosure is now described with reference to the following examples. Before describing several exemplary embodiments of the disclosure, it is to be understood that the disclosure is not limited to the details of construction or process steps set forth in the following description. The disclosure is capable of other embodiments and of being practiced or being carried out in various ways.

EXAMPLES

Example 1: Comparative

An untreated wafer was subjected to an incubation process for the in-situ nucleation of diamond particles. During incubation, a carbon-rich gas mixture comprising of 5-90% of methane ($CH_4$), ethane ($C_2H_6$), propane ($C_3H_8$), butane ($C_4H_{10}$), pentane ($C_6H_{12}$), hexane ($C_6H_{14}$), heptane ($C_7H_{16}$), ethene ($C_2H_4$), propene ($C_3H_6$), butene ($C_4H_{18}$), pentene ($C_6H_{10}$), hexene ($C_6H_{12}$), heptane ($C_7H_{14}$), ethyne ($C_2H_2$), propyne ($C_3H_4$), butyne ($C_4H_6$), pentyne ($C_6H_8$), hexyne ($C_6H_{10}$) and/or heptyne ($C_7H_{12}$) was supplied to ensure sufficient carbon source for the nucleation of diamond particles. This was conducted under a relatively weak plasma power of less than 12 kW, 100% duty cycle and 75 Hz, for less than 4 hours. Stage temperature was below 450° C., and the gap was maintained between 2 to 10 cm.

Thereafter, a stronger plasma greater than 50 W and 50% duty cycle was applied for the growth of the diamond particles into nanocrystalline diamond film. This main growth process was conducted at a stage temperature between 100-750° C., and at a gap of less than 10 cm.

Example 2: Carbon-Rich Incubation

A silicon wafer was loaded into a conductively or inductively coupled plasma, microwave plasma, pulsed discharge plasma, hot filament, or electron cyclotron resonance plasma chamber and pre-cleaned/treated with a mild $C_xH_y$, argon (Ar), molecular nitrogen ($N_2$), carbon dioxide ($CO_2$), and/or molecular hydrogen gas ($H_2$) plasma greater than 50 W to prepare a treated substrate. The stage temperature was maintained between 20-600° C. throughout the entire process and the gap between the stage and plasma source was greater than 20 mm.

The plasma-treated wafer was then subjected to an incubation process for the in-situ nucleation of diamond particles. During incubation, a carbon-rich gas mixture comprising of 5-90% of methane ($CH_4$), ethane ($C_2H_6$), propane ($C_3H_8$), butane ($C_4H_{10}$), pentane ($C_6H_{12}$), hexane ($C_6H_{14}$), heptane ($C_7H_{16}$), ethene ($C_2H_4$), propene ($C_3H_6$), butene ($C_4H_8$), pentene ($C_6H_{10}$), hexene ($C_6H_{12}$), heptane ($C_7H_{14}$), ethyne ($C_2H_2$), propyne ($C_3H_4$), butyne ($C_4H_6$), pentyne ($C_6H_8$), hexyne ($C_6H_{10}$) and/or heptyne ($C_7H_{12}$) was supplied to ensure sufficient carbon source for the nucleation of diamond particles. This was conducted under a relatively weak plasma power of less than 12 kW, 100% duty cycle and 75 Hz, for less than 4 hours. Stage temperature was below 450° C., and the gap was maintained between 2 to 10 cm.

Thereafter, a stronger plasma greater than 50 W and 50% duty cycle was applied for the growth of the diamond particles into nanocrystalline diamond film. This main growth process was conducted at a stage temperature between 100-750° C., and at a gap of less than 10 cm.

The nucleation density on untreated (Example 1) and plasma-treated silicon (Example 2) after incubation and a short main growth process was compared. The samples were characterized by scanning electron microscopy (SEM) and Raman measurement (325 nm laser). It was observed that under identical process conditions, significantly higher nucleation density was achieved on plasma-treated silicon sample (Example 2) as compared to the untreated silicon (Example 1) (4.3 particles µm$^{-2}$).

After being subjected to an extended period of main growth, the high nucleation density on plasma-treated silicon (Example 2) eventually led to the formation of a fully coalesced monocrystalline diamond film. The morphologies and Raman measurement of a monocrystalline diamond film grown by the in-situ nucleation method are also comparable to that of a ND-seeded wafer prepared by the conventional solution-based seeding. Film properties such as refractive index, extinction coefficient, roughness, hardness and modulus were validated to be comparable to that of the ND-seeded samples. On the other hand, the poor nucleation density on untreated silicon (Example 1) resulted in an incompletely coalesced monocrystalline diamond film with obvious grain boundaries and pinholes throughout the sample.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below," or "beneath" other elements or features would then be oriented "above" the other elements or features. Thus, the exemplary term "below" may encompass both an orientation of above and below. The device may be otherwise oriented (rotated 90 degrees or at other orientations) and the spatially relative descriptors used herein interpreted accordingly.

The use of the terms "a" and "an" and "the" and similar referents in the context of describing the materials and methods discussed herein (especially in the context of the following claims) are to be construed to cover both the singular and the plural, unless otherwise indicated herein or clearly contradicted by context. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the materials and methods and does not pose a limitation on the scope unless otherwise claimed. No language in the specification should be construed as indicating any non-claimed element as essential to the practice of the disclosed materials and methods.

Reference throughout this specification to "one embodiment," "certain embodiments," "one or more embodiments" or "an embodiment" means that a particular feature, structure, material, or characteristic described in connection with the embodiment is included in at least one embodiment of the disclosure. Thus, the appearances of the phrases such as "in one or more embodiments," "in certain embodiments," "in one embodiment" or "in an embodiment" in various places throughout this specification are not necessarily referring to the same embodiment of the disclosure. In one or more embodiments, the particular features, structures, materials, or characteristics are combined in any suitable manner.

Although the disclosure herein has been described with reference to particular embodiments, it is to be understood that these embodiments are merely illustrative of the principles and applications of the present disclosure. It will be apparent to those skilled in the art that various modifications and variations can be made to the method and apparatus of the present disclosure without departing from the spirit and scope of the disclosure. Thus, it is intended that the present disclosure include modifications and variations that are within the scope of the appended claims and their equivalents.

What is claimed is:

1. A method of forming a nanocrystalline diamond film, the method comprising:
   exposing a silicon substrate to a first plasma from a plasma source with a first plasma power in a range of from 50 W to 12 kW, the first plasma source comprising one or more of $C_xH_y$ wherein y≥x, carbon dioxide ($CO_2$), hydrogen ($H_2$), nitrogen ($N_2$), and argon (Ar) to provide a treated substrate;
   incubating the treated substrate with a gas stream and a second plasma to nucleate diamond particles on a top surface of the substrate, the gas stream comprising a hydrocarbon and the second plasma having a power less than or equal to 15 kW; and
   exposing the diamond particles to a third plasma having a power greater than 50 W to form a nanocrystalline diamond film on the top surface of the substrate, the third plasma comprising a microwave plasma with a duty cycle greater than or equal to 60%.

2. The method of claim 1, wherein the hydrocarbon has a general formula of $C_mH_n$, where m is in a range of from 1 to 120, and n is in a range of from 2 to 242.

3. The method of claim 2, wherein the gas stream further comprises one or more of carbon dioxide ($CO_2$), hydrogen ($H_2$), nitrogen ($N_2$), and argon (Ar).

4. The method of claim 3, wherein the gas stream comprises from 5% to 90% of the hydrocarbon.

5. The method of claim 1, wherein the gas stream is ignited at a power of less than 12 kW.

6. The method of claim 1, wherein the treated substrate is incubated with the gas stream and the second plasma for a time period of less than 4 hours.

7. The method of claim 1, wherein the treated substrate is maintained at a temperature of less than 450° C. during incubation.

8. The method of claim 1, wherein the diamond particles are maintained at a temperature in a range of from 100° C. to 750° C. during formation of the nanocrystalline diamond film.

9. The method of claim 1, wherein incubating the treated substrate is conducted with a duty cycle of less than 100%.

10. The method of claim 1, wherein the third plasma has a duty cycle greater than 70%.

11. The method of claim 1, wherein the substrate is exposed to the first plasma at a temperature in a range of from 20° C. to 600° C.

12. The method of claim 1, wherein the substrate is exposed to the first plasma at a distance of greater than 2 cm.

13. The method of claim 1, wherein when the treated substrate is incubated with the gas stream, the gas stream is about 2 cm to 10 cm away from the top surface of the treated substrate.

14. The method of claim 1, wherein when the diamond particles are exposed to the third plasma, the third plasma is less than 10 cm away from the top surface of the substrate.

* * * * *

UNITED STATES PATENT AND TRADEMARK OFFICE
CERTIFICATE OF CORRECTION

PATENT NO. : 11,946,134 B2
APPLICATION NO. : 17/585755
DATED : April 2, 2024
INVENTOR(S) : Sze Chieh Tan et al.

It is certified that error appears in the above-identified patent and that said Letters Patent is hereby corrected as shown below:

In the Specification

•Column 8, Line 17, replace "$C_6H_{12}$" after "pentane (" and before "), hexane" with "$C_5H_{12}$".

•Column 8, Line 19, replace "$C_6H_{10}$" after "pentene (" and before "), hexene" with "$C_5H_{10}$".

•Column 8, Line 20, replace "$C_6H_8$" after "pentyne (" and before ")," with "$C_5H_8$".

•Column 8, Line 49, replace "$C_6H_{12}$" after "pentane (" and before "), hexane" with "$C_5H_{12}$".

•Column 8, Line 51, replace "$C_6H_{10}$" after "pentene (" and before "), hexene" with "$C_5H_{10}$".

•Column 8, Line 53, replace "$C_6H_8$" after "(" and before "), hexyne" with "$C_5H_8$".

Signed and Sealed this
Twenty-first Day of May, 2024

Katherine Kelly Vidal
*Director of the United States Patent and Trademark Office*